United States Patent
Singidi et al.

(10) Patent No.: US 11,561,722 B2
(45) Date of Patent: Jan. 24, 2023

(54) MULTI-PAGE PARITY DATA STORAGE IN A MEMORY DEVICE

(71) Applicant: MICRON TECHNOLOGY, INC., Boise, ID (US)

(72) Inventors: Harish R Singidi, Fremont, CA (US); Ashutosh Malshe, Fremont, CA (US); Vamsi Pavan Rayaprolu, San Jose, CA (US); Kishore Kumar Muchherla, Fremont, CA (US)

(73) Assignee: Micron Technology, Inc., Boise, ID (US)

(*) Notice: Subject to any disclaimer, the term of this patent is extended or adjusted under 35 U.S.C. 154(b) by 107 days.

(21) Appl. No.: 17/002,374

(22) Filed: Aug. 25, 2020

(65) Prior Publication Data
US 2022/0066678 A1    Mar. 3, 2022

(51) Int. Cl.
G06F 3/06     (2006.01)
H03M 7/30    (2006.01)
G06F 11/10   (2006.01)

(52) U.S. Cl.
CPC .......... *G06F 3/0652* (2013.01); *G06F 3/0608* (2013.01); *G06F 3/0679* (2013.01); *G06F 11/1004* (2013.01); *H03M 7/6011* (2013.01)

(58) Field of Classification Search
CPC .... G06F 3/0652; G06F 3/0608; G06F 3/0679; G06F 11/1004; H03M 7/6011
See application file for complete search history.

(56) References Cited

U.S. PATENT DOCUMENTS

| 8,429,359 | B1* | 4/2013 | Desai | G06F 11/1461 711/E12.103 |
| 8,538,919 | B1* | 9/2013 | Nielsen | H04L 63/0272 718/1 |

(Continued)

FOREIGN PATENT DOCUMENTS

WO    WO-2019178538 A1 *  9/2019  .......... G06F 11/1068

OTHER PUBLICATIONS

K. R. Krishnapriya et al., "An Efficient Test Data Compression Based on Iterative XOR Matric Computation", ARPN Journal of Engineering and Applied Science, vol. 11, No. 9, May 9, 2016, pp. 1-4, http://www.arpnjournals.org/jeas/research_papers/rp_2016/jeas_0516_4159.pdf (Year: 2016).*

(Continued)

*Primary Examiner* — Christopher D Birkhimer
(74) *Attorney, Agent, or Firm* — Lowenstein Sandler LLP (57) ABSTRACT

A processing device, operatively coupled with a memory device, is configured to perform a write operation on a page of a plurality of pages of a data unit of a memory device, to store host data in the page of the data unit. The processing device further generates a parity page for the host data stored in the page of the data unit and adds the parity page to parity data stored at a parity data storage location. Responsive to determining that a first size of the stored parity data satisfies a first condition, the processing device initiates execution of a compression algorithm to compress the stored parity data. Responsive to determining that a second size of the parity data resulting from the execution of the compression algorithm satisfies a second condition, the processing device performs a scan operation to release at least a subset of the stored parity data.

20 Claims, 6 Drawing Sheets

(56) References Cited

U.S. PATENT DOCUMENTS

| | | | | |
|---|---|---|---|---|
| 8,593,678 B2* | 11/2013 | Ohishi | | H04N 1/2166 |
| | | | | 358/1.15 |
| 9,075,705 B2* | 7/2015 | Hikichi | | G06F 11/004 |
| 9,092,182 B2* | 7/2015 | Ohishi | | H04N 1/00944 |
| 9,344,596 B2* | 5/2016 | Ohishi | | H04N 1/00973 |
| 9,800,291 B1* | 10/2017 | Ben David | | H04W 12/06 |
| 10,248,319 B2* | 4/2019 | Alatorre | | G06F 3/0608 |
| 10,324,893 B1* | 6/2019 | Telang | | G06F 11/1458 |
| 10,649,905 B2* | 5/2020 | Kong | | G06F 16/24552 |
| 11,200,124 B2* | 12/2021 | Rathi | | G06F 11/1458 |
| 2004/0117414 A1* | 6/2004 | Braun | | G06F 8/65 |
| 2005/0237572 A1* | 10/2005 | Mori | | G06F 40/103 |
| | | | | 358/1.17 |
| 2008/0140902 A1* | 6/2008 | Townsend | | H04B 1/0475 |
| | | | | 710/306 |
| 2008/0307020 A1* | 12/2008 | Ko | | G06F 21/6245 |
| 2011/0236049 A1* | 9/2011 | Haga | | G03G 15/5004 |
| | | | | 399/75 |
| 2012/0102005 A1* | 4/2012 | Kamei | | G06F 3/064 |
| | | | | 707/693 |
| 2012/0179655 A1* | 7/2012 | Beatty | | G06F 11/1469 |
| | | | | 707/646 |
| 2013/0024423 A1* | 1/2013 | Doshi | | G06F 11/1448 |
| | | | | 707/640 |
| 2013/0173554 A1* | 7/2013 | Ubukata | | G06F 11/2094 |
| | | | | 707/640 |
| 2014/0143517 A1* | 5/2014 | Jin | | G06F 3/067 |
| | | | | 711/171 |
| 2015/0378612 A1* | 12/2015 | Bhat | | G06F 9/45558 |
| | | | | 711/154 |
| 2017/0132082 A1* | 5/2017 | Resch | | G06F 3/067 |
| 2020/0081780 A1* | 3/2020 | Li | | G06F 12/0253 |
| 2020/0117664 A1* | 4/2020 | Kondiles | | G06F 9/4406 |
| 2020/0192758 A1* | 6/2020 | Pletka | | G06F 3/0665 |
| 2020/0249869 A1* | 8/2020 | Glimcher | | G06F 3/0608 |

OTHER PUBLICATIONS

Adrian Colyer. "Gorilla: A fast, scalable, in-memory time series database", May 3, 2016, 1-11, https://blog.acolyer.org/2016/05/03/gorilla-a-fast-scalable-in-memory-time-series-database/ (Year: 2016).*

Aliaksandr Valialkin, "VictoriaMetrics: achieving better compression than Gorilla for time series data", May 20, 2019, pp. 1-6, https://faun.pub/victoriametrics-achieving-better-compression-for-time-series-data-than-gorilla-317bc1f95932 (Year: 2019).*

* cited by examiner

MULTI-PAGE PARITY DATA STORAGE IN A MEMORY DEVICE

TECHNICAL FIELD

The present disclosure generally relates to memory subsystems, and more specifically, relates to supporting multi-page parity data storage in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to supporting multi-page parity data storage in memory devices of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices that store data. The host system can provide data to be stored at the memory sub-system and can request data to be retrieved from the memory sub-system.

A memory sub-system can include multiple memory devices that can store data from a host system. A memory device can be a non-volatile memory device. A non-volatile memory device is a package of one or more dies. One example of non-volatile memory devices is a negative-and (NAND) memory device. Other examples of non-volatile memory devices are described below in conjunction with FIG. 1. The dies in the packages can be assigned to one or more channels for communicating with a memory sub-system controller. Each die can consist of one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. A data unit can be the entire memory sub-system, a die of memory component, a collection of codewords, a collection of memory pages, a collection of memory blocks, or any other meaningful portion of the memory sub-system.

As data gets written to a memory cell of the memory device for storage, the memory cell, with time, can deteriorate and can eventually become defective. For example, when too many read and write operations are performed on a memory cell, data stored at the memory cell and adjacent memory cells of the memory component can become corrupted or incorrectly stored at the memory cell. Additionally, many memory sub-systems support a redundancy mechanism to protect the host data against a failure of a portion of a memory device that is storing the host data. For example, for a negative-and (NAND) type flash memory device, the memory sub-system can implement a redundant array of independent NAND (RAIN) operations to provide redundancy for the data stored on the memory sub-system. As an example, the memory sub-system can generate parity data when writing data received from the host system to the memory sub-system to be able to reconstruct or recalculate the host data in the event of a failure of the portion of the memory device that is storing data from the host system. This parity data is temporarily stored at a certain location of the memory sub-system, such that it can be released when the corresponding pages of memory are determined to be free from reliability issues or likelihood of defects. Therefore, in order to be able to release parity data and to detect a potential occurrence of a defect before a data loss is caused by the defect, the memory sub-system performs operations (e.g., scanning the data by performing data integrity checks) to detect the likelihood of the occurrence of a defect at data units. In this case, the memory sub-system frequently scans the data units of the memory sub-system in order to detect and address defects that can exist in host data stored in the data units.

On the other hand, performing the scan operations for data integrity checks is costly and can introduce latency due to the read operations, repeated error detection, and correction operations that take place during a scan operation. As an example, for a given data unit, if every page is scanned and then possibly exposed to a correction operation (error control operation), this process can result in a reduction of the overall performance of a memory sub-system. Furthermore, as more resources of the memory sub-system are used to perform the error control operations, fewer resources are available to perform other read operations or write operations of host data. Therefore, scanning operation frequency (how often to run a scan) can be tuned to minimize latency and performance penalties.

Additionally, the space allocated by the memory sub-system for storing parity data is typically limited, in order to reserve most of the storage space of the memory sub-system to storing host data. Therefore, it can be desirable to preserve the parity data storage space while reducing the frequency of running scan operations of the data units of the memory sub-system.

Common practices to preserve parity data storage include temporarily storing parity data at the dedicated storage space until the corresponding host data pages are shown to be free from defect, at which time parity data can be released. In this case, a memory sub-system runs a scan operation during an idle time of the memory sub-system, in order to ensure minimal interruptions to host-related operations of the memory sub-system. As a result of performing a scan operation, at least a portion of the parity data can be released for the host data pages that are shown to be free from defects, based on the scan results. While this approach enables a reuse of the parity data storage space, as old parity data is released and new parity data is added, it may not be sufficient to persistently ensure that the parity data storage will not run out before a scan operation is performed. For example, if the memory sub-system does not encounter an idle time for an extended period of time, the parity data storage can be filled up before the memory sub-system gets a chance to perform a scan operation to release some of the parity data, thereby risking that some write operations of host data are being programmed without parity data.

Aspects of the present disclosure address the above and other deficiencies by providing techniques for compressing parity data in a memory device to reserve parity data storage space while minimizing the frequency of scan operations performed on data units of a memory device. In one implementation, the size of the parity data stored at the parity data storage location can be determined and then compared to a predetermined threshold, in order to find out if the execution of a compression algorithm of parity data can be initiated. For example, if the size of consumed parity blocks of the parity data storage location exceeds a certain percentage of the parity data storage space, execution of a compression algorithm can be initiated to compress the parity data stored at the parity data storage location. The compressed parity pages are referred to herein as the multi-page parity data. In other implementations, the execution of the compression algorithm can also be initiated upon detecting that pages of host data that are outside a blast radius from one another have been stored at memory devices of the memory sub-system. In certain implementations, in order to compress parity data, the compression algorithm can compress multiple pages of uncompressed parity data into a single parity page of compressed parity data. The compressed parity page can then be marked as compressed and can be stored at the parity data storage location. After storing the single page of the compressed parity data, the multiple pages of uncompressed parity data can be released, thus reducing the overall size of the consumed parity blocks of the parity data storage location.

In certain implementations, two or more parity pages that can be compressed together can be selected such that they correspond to two or more pages of host data that are outside a blast radius from one another, in order to ensure that the two page are unlikely to be impacted by the same defect, as explained in more details below. After initiating the execution of the compression algorithm and as new write operations of host data are performed, the compression algorithm can continue to be executed to compress more parity pages of the consumed parity blocks, as additional parity pages are added to the consumed parity blocks. Therefore, as a result of compressing the parity pages, the rate of growth of the consumed parity blocks of the parity storage space is significantly reduced. Accordingly, the memory sub-system can continue to generate and store parity data for extended periods of time without having to release parity data.

A scan operation can eventually be performed in order to release parity data from the parity data storage location. In an implementation, when the size of consumed parity blocks of the parity data storage location exceeds a second percentage (e.g., more than 75% of the parity data storage space is consumed), the memory sub-system can initiate the performance of a scan operation in order to release at least a portion of the parity data stored at the parity data storage location. When the scan operation is performed, a certain portion of the stored parity data can be released (e.g., the portion of the parity data that corresponds to host data that are free from defects can be released). After releasing parity data, and assuming there are parity pages that can be compressed together, the compression algorithm can continue to be executed to compress parity data as new host data is written in the memory sub-system.

The techniques of supporting multi-page parity data storage in a memory sub-system are described herein enable an improved overall performance of the memory sub-system while preserving the limited storage space of the parity data. By compressing the parity pages such that the same amount of parity data can be stored in a smaller unit or memory, the memory sub-system can perform host operations with minimal interruptions caused by scan operations, while simultaneously fully supporting parity data generation and storage. Additionally, since performing health checks in memory devices, e.g., by scanning the data units of the memory devices, introduces performance penalty as the bandwidth of the memory sub-system is at least partially consumed in executing the scan operations, reducing the frequency of performing the scan operations can improve the overall performance of the memory sub-system. Therefore, by performing a scan operation only when the consumption rate of the parity storage space reaches a high threshold, the frequency of performing the scan operations can be reduced significantly. Further, because performing a scan operation is no longer dependent on the occurrence of an idle time for the memory sub-system, the memory sub-system can continue to efficiently generate and store parity data as host data is being stored in the memory sub-system even when the memory sub-system runs for an extended period of time with no periods of idle time.

Figure 1:
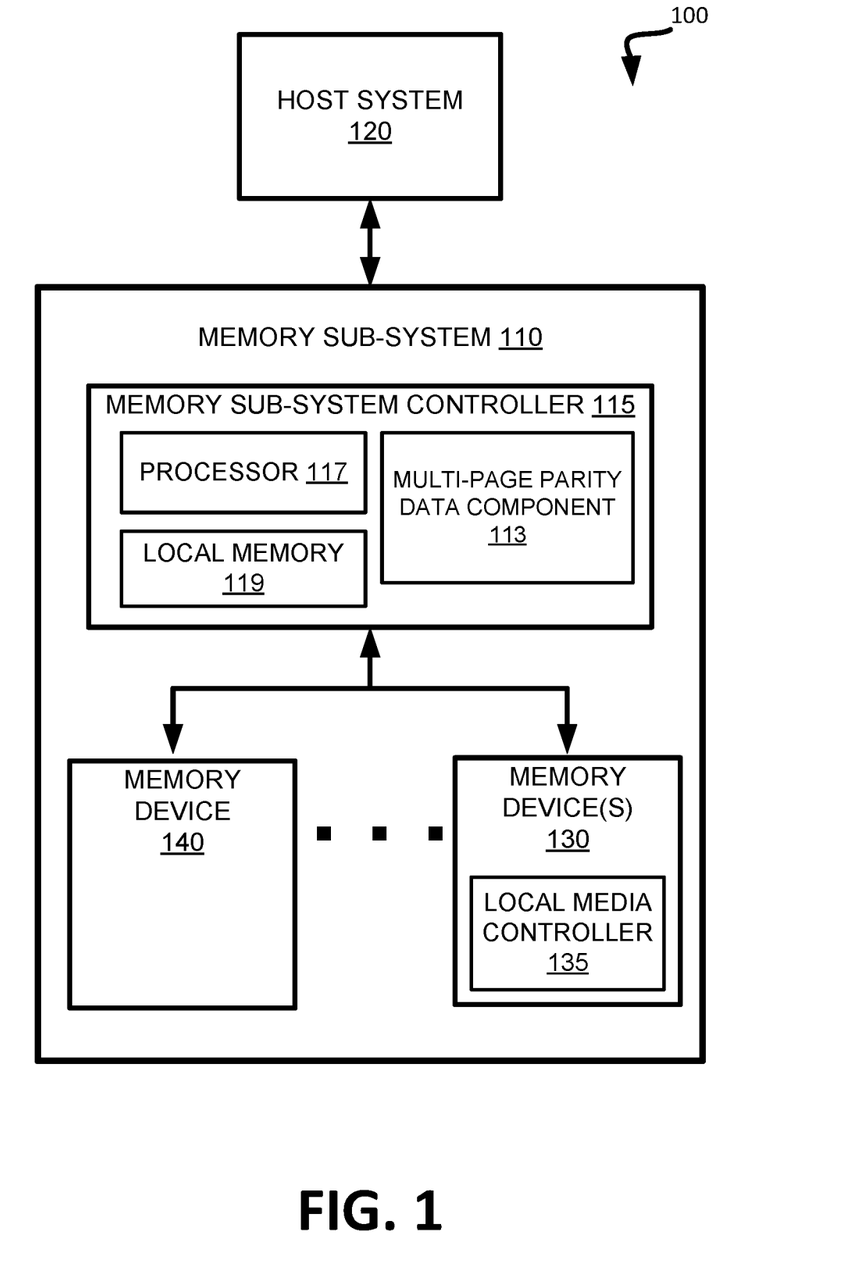
FIG. 1 illustrates an example computing system for supporting multi-page parity data storage in a memory device, in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A 3D cross-point memory device is a cross-point array of non-volatile memory cells that can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric random access memory (FeRAM), ferroelectric transitor random-access memory (FeTRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In some embodiments, the memory sub-system 110 includes multi-page parity data component 113 that can be used to support compressing parity data in a memory device to reserve parity data storage space while minimizing the frequency of scan operations performed on data units of the memory device. Parity data can be implemented by memory sub-system 110 to provide a recovery mechanism for the host data in case of a failure of a portion of a memory device that is storing the host data, as explained in more details below. In one implementation, parity data storage location can reside in a dedicated memory device of memory sub-system 110. In another implementation, parity data storage location can be a memory region within the memory device that is storing the host data. In this case, the memory region can be dedicated to storing parity data exclusively. In either implementations, parity data can be stored temporarily at the storage location, such that over time old parity data can be released and new parity data can be stored at the parity data storage location. As an example, when a data unit of host data is scanned and is determined to be free from defects, page of parity data corresponding to the data unit can be released, thus reducing the size of consumed parity blocks of the parity data storage location. The term "consumed parity blocks" refers to the portion of the parity data storage location that is occupied with parity pages. The rest of the parity data storage location can be free and available for storing more parity pages.

In implementations, when multi-page parity data component 113 determines that the size of consumed parity blocks of a parity data storage location exceeds a certain first threshold (e.g., more than 25% of the parity data storage space is consumed), multi-page parity data component 113 can initiate the execution of a compression algorithm to compress the parity data stored at the parity data storage location, resulting in a multi-page parity data stored at the parity data storage location. In other implementations, multi-page parity data component 113 can initiate the execution of the compression algorithm when detecting that pages of host data that are outside a blast radius from one another have been stored at memory devices 130-140. In implementations, in order to compress parity data, the compression algorithm can perform an exclusive-OR operation on two or more parity pages of the parity data stored at the parity data storage location to generate a single page of compressed parity data. In this case, multiple pages of uncompressed parity data are compressed into a single page of compressed parity data. After storing the single page of the compressed parity data, the multiple pages of uncompressed parity data can be released, thus reducing the overall size of the consumed parity blocks of the parity data storage location.

In certain implementations, multi-page parity data component 113 can select the two or more parity pages to be compressed together such that the compressed parity data can still be used to recover host data in the event of a data loss. Given that the recovery of lost data using host data and parity data assumes that the loss occurred in only one page, the two or more pages that can be compressed together can be a set of pages that are unlikely to be impacted by the same defect. In an implementation, the two or more pages can be selected for compression such that the two or more pages correspond to host data pages that are outside a blast radius from one another. A blast radius of a memory device refers to a depth of radius of wordlines (WLs) around a page being programmed that determines the set of adjacent pages that can be impacted by programming the page, such that a defect can be introduced to any of the set pages within the blast radius as a result of programming the page in the center of the blast radius. For example, if the blast radius for memory sub-system 110 is 1, then for a certain page in a certain wordline (WL), the blast radius of the page can include the pages within the same WL, pages that are within the WL preceding the certain WL, and pages that are within the WL following the certain WL. Accordingly, multi-page parity data component 113 can select the two or more parity pages for compression such that each page is on a WL that is at least two WLs away from the WL of the next page, and so on.

After initiating the execution of the compression algorithm and as new write operations of host data are performed, multi-page parity data component 113 can continue to execute the compression algorithm to compress more parity pages of the consumed parity blocks, as additional parity pages are added to the consumed parity blocks. While the size of consumed parity blocks will continue to grow as more host data is written to memory device 130, the rate of growth of the consumed parity blocks is significantly reduced as a result of compressing the multiple parity pages into the single compressed parity page. Accordingly, memory sub-system 110 can continue to generate and store parity data for extended periods of time without having to perform a scan operation to release parity data of memory devices 130-140. As an example, when memory sub-system 110 is configured to perform scan operations during idle time, due to the parity data compression process, memory sub-system 110 can continue to generate and store parity data as host data is being stored even when memory sub-system 110 runs for an extended period of time with no periods of idle time.

Even though the process of compressing parity data into multi-page parity data results in reducing the size of space needed for storing parity data for a given set of host data (e.g., a data unit of host data), the parity data storage space can eventually be consumed with parity data and a scan operation can be performed to release at least some of the parity data stored at the parity data storage location. In an implementation, multi-page parity data component 113 can determine that when the size of consumed parity blocks of the parity data storage location exceeds a second threshold (e.g., more than 75% of the parity data storage space is consumed), multi-page parity data component 113 can determine that the parity data storage space is reaching a maximum capacity. Multi-page parity data component 113 can then initiate the performance of a scan operation in order to release at least a portion of the parity data stored at the parity data storage location.

When the scan operation is performed, certain portions of the stored parity data can be released, as explained above. Consequently, multi-page parity data component 113 can continue to execute the compression algorithm to compress parity data into multi-page parity granularity if the size of consumed parity blocks after releasing the portion of the parity data still exceeds the first threshold. On the other hand, if the size of consumed parity blocks is below the first threshold, multi-page parity data component 113 can stop executing the compression algorithm of parity data, at least until the size of consumed parity blocks reaches the first threshold.

Figure 2:
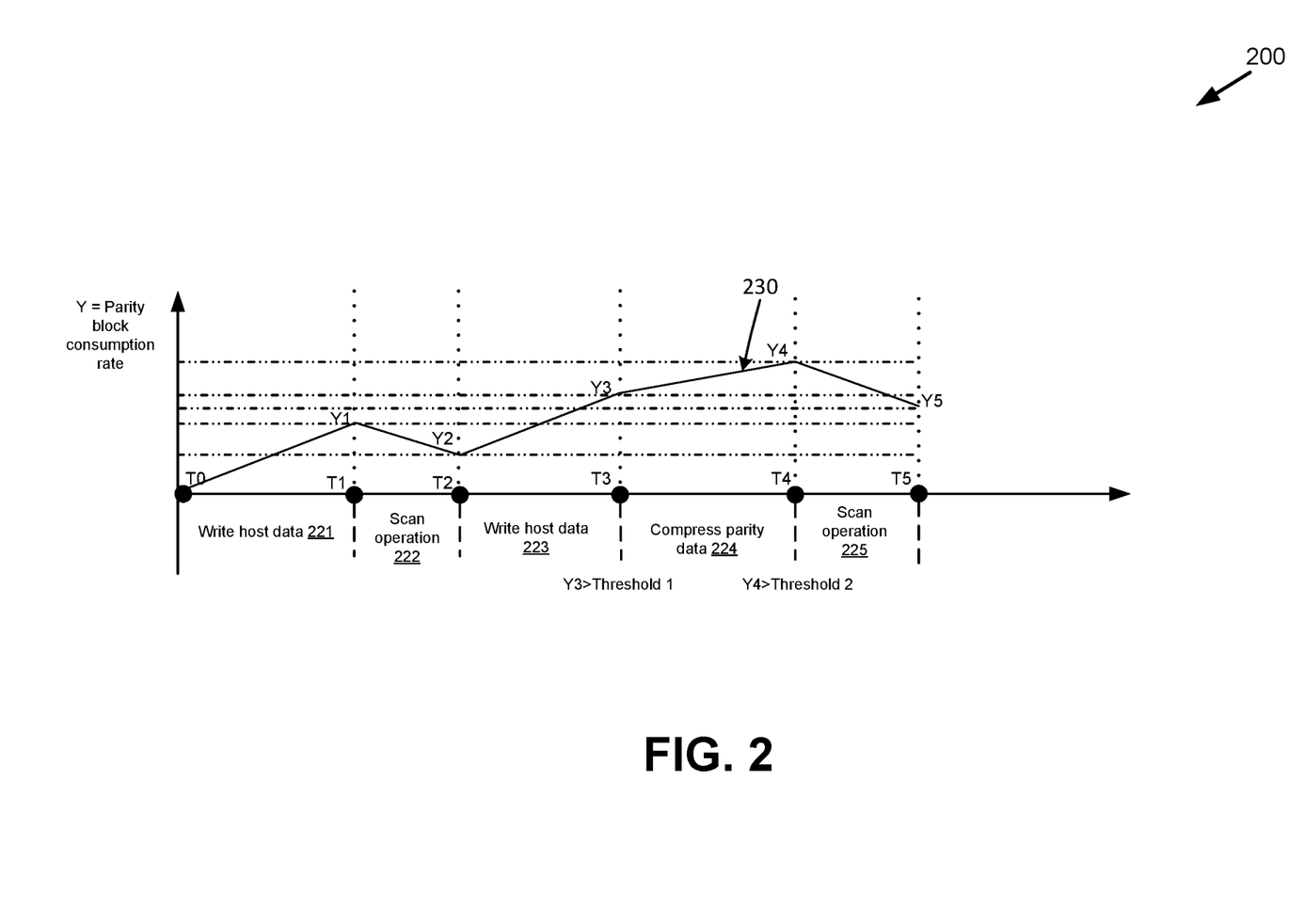
FIG. 2 illustrates the change in parity block consumption rate based on workload and activities in a memory sub-system that, in accordance with some embodiments of the present disclosure.

FIG. 2 illustrates the change in parity block consumption rate based on workload and activities in a memory sub-system that, in accordance with some embodiments of the present disclosure. In one implementation, parity block consumption rate graph 230 represents a pattern of change in the size of consumed parity blocks over time, as write operations and scan operations are performed on the memory sub-system. At operation 221, memory sub-system 110 of FIG. 1 can perform one or more program operations between T0 and T1 to write host data in data units of a memory device. In this case, for each page of host data that is programmed in the data units, a parity page is generated and stored at a parity data storage location. Accordingly, parity block consumption rate can increase at a high rate until it reaches Y1 at time T1.

At time T1, memory sub-system 110 can encounter an idle time where the memory sub-system is not busy programming host data on a memory device. In certain implementations, memory sub-system 110 can be configured to perform scan operations during idle times of the memory sub-system. Thus, memory sub-system 110, at operation 222, can perform a scan operation and can release at least a portion of the parity data based on the results of the scan operation. As an example, memory sub-system 110 can scan a sample of pages of one or more data units of the memory sub-system to determine whether any of the pages has a defect. When memory sub-system 110 determines that the scanned pages are free from defects, memory sub-system 110 can release parity data associated with the scanned pages, thus freeing some storage space at the parity data storage location. Accordingly, when the scan operation is performed, at T2, parity block consumption rate can be decreased to Y2 as a result of performing the scan operation.

At operation 223, memory sub-system 110 can continue to perform program operations between T2 and T3 to write host data as new write requests are received from a host. Memory sub-system 110 can further continue to generate and store parity pages corresponding to pages of host data that are programmed in the memory devices of memory sub-system 110. Accordingly, parity block consumption rate can increase again until it reaches a value of Y3 at time T3. At T3, memory sub-system 110 can determine that Y3 exceeds threshold 1, indicating that memory sub-system can start compressing stored parity data into multi-page parity data, in order to preserve the parity data storage space. As an example, memory sub-system 110 can determine that a compression algorithm can start executing when the parity block consumption rate is higher than 25% of the parity data storage space At operation 224, memory sub-system 110 can start executing a compression algorithm to compress parity data stored at the parity data storage location. In implementations, in order to compress parity data, the compression algorithm can perform an exclusive-OR operation on two or more parity pages of the parity data stored at the parity data storage location to generate a single parity page of compressed parity data. In this case, multiple pages of uncompressed parity data are compressed into a single parity page of compressed parity data. In certain implementations, memory sub-system 110 can mark the parity page of compressed parity data as a multi-page parity page, in order to distinguish it from uncompressed parity pages. After storing the single page of the compressed parity data, the multiple pages of uncompressed parity data can be released. As new write operations of host data are performed, memory sub-system 110 can continue to execute the compression algorithm to compress more parity pages of the consumed parity blocks to multi-page parity pages. Accordingly, parity block consumption rate can increase between T3 and T4 at a slower rate as a result of compressing the parity data.

At T4, memory sub-system 110 can determine that parity block consumption rate of Y4 exceeds threshold 2, indicating that memory sub-system can perform a scan operation to release at least a portion of the parity data stored at the parity data storage location. As an example, memory sub-system 110 can determine that a scan operation can be performed when the parity block consumption rate is higher than 75% of the parity data storage space. Consequently, memory sub-system 110, at operation 225, can perform a scan operation on pages of host data of memory devices 130-140. In certain implementations, when the scan operation is performed on the host data of a given data unit, memory sub-system 110 can release parity data that corresponds to the scanned host data that is free from defects (based on the scan results). On the other hand, if the scan operation results in one or more pages of the host data having defects, memory sub-system 110 can maintain the parity data that corresponds to the one or more defective pages of the host data. Memory sub-system 110 can then utilize the parity data to recover data loss that may be have occurred due to the defects of the one or more pages.

When the scan operation has been completed at T5, certain portion of the stored parity data can be released and the parity block consumption rate can drop to a value of Y5, allowing more parity data to be stored at the parity data storage location. In this case, memory sub-system 110 can determine whether or not to continue to execute the compression algorithm to compress parity data into multi-page parity granularity. For example, if the size of consumed parity blocks after releasing the portion of the parity data still exceeds threshold 1, memory sub-system 110 can continue to execute the compression algorithm to compress parity data as host data gets written to memory devices 130-140. On the other hand, if the size of consumed parity blocks is below threshold 1, memory sub-system 110 can stop executing the compression algorithm of parity data, at least until the parity block consumption rate reaches threshold 1 again.

Figure 3:
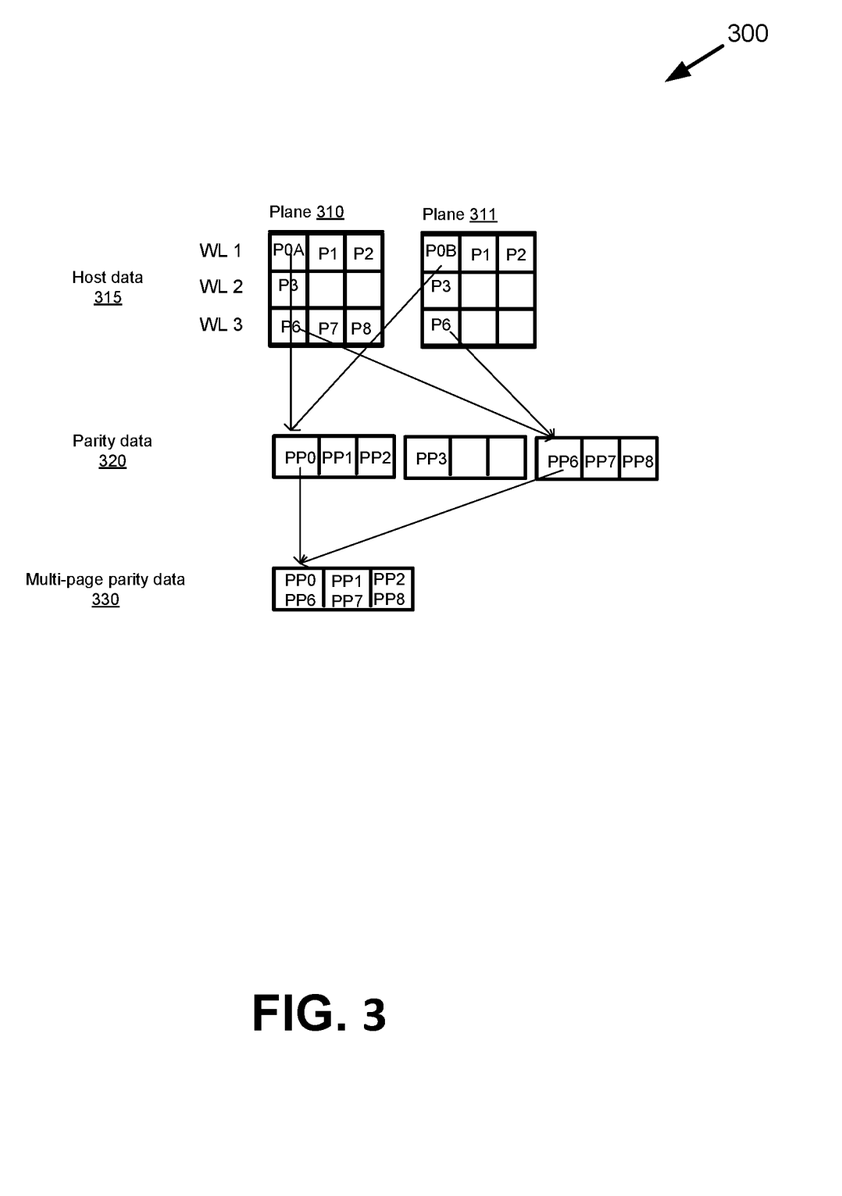
FIG. 3 is a block diagram illustrating an example process of generating parity data associated with host data and generating multi-page parity data associated with uncompressed parity data, in accordance with some embodiments of the present disclosure.

FIG. 3 is a block diagram illustrating an example process of generating parity data associated with host data and generating multi-page parity data associated with uncompressed parity data, in accordance with some embodiments of the present disclosure. In implementations, host data 315 can be stored in planes 310-311. Planes 310-311 can the same die or separate dies of the memory sub-system. Each plane can comprise a group of wordlines (WL)s including WL 1, WL 2, and WL 3. In an illustrative example, WL 1 can include three pages, P0A, P1, P2. WL 2 can include three pages including P3. WL 3 can similarly include three pages including P6. As host data is programmed to pages of planes 310 and 311, parity data corresponding to the host data is also generated by memory sub-system 110 of FIG. 1 and stored at a dedicated parity data storage location.

Parity data can support a redundancy mechanism implemented by memory sub-system 110 to protect the host data against a failure of a portion of a memory device that is storing the host data. As an example, for a negative-and (NAND) type flash memory device, memory sub-system 110 can implement a redundant array of independent NAND (RAIN) operation to provide redundancy for the data stored on memory sub-system 110. For example, memory sub-system 110 can generate parity data when writing data received from the host system to memory sub-system 110. Memory sub-system 110 can generate the parity data based on an exclusive-or (XOR) operation of the pages of host data and use the parity data to reconstruct or recalculate the host data in the event of a failure of one of the pages that is storing data from the host system. As an example, memory sub-system 110 can calculate a parity page for a particular number of host data pages of a data unit of memory sub-system 110. The parity pages can be generated based on an XOR operation among each page of the particular number of pages storing host data. The parity pages can then be stored at a data storage location dedicated for parity data. If one of the pages storing host data fails and the corresponding data is lost or corrupt, then memory sub-system 110 can reconstruct the lost/corrupt data based on an XOR operation among the rest of the host data pages and the corresponding parity pages.

Parity data 320 can include parity pages (PP)s PP0-PP8, and can be stored at a memory unit dedicated for storing parity data. In implementations, in order to generate parity page PP0, memory sub-system 110 can perform an XOR operation on each page0 of each plane and each die of memory sub-system 110. The resulting page of the XOR operation comprises PP0. In this case, PP0 can be the resulting page of performing an XOR operation on P0A of plane 310 and P0B of plane 311. Similarly, PP1 can be the resulting page of performing an XOR operation on P1 of plane 310 and P1 of plane 311, PP2 can be the resulting page of performing an XOR operation on P2 of plane 310 and P2 of plane 311, and son on.

Multi-page parity data 330 can be generated by compressing two or more parity data into a single parity page. In implementations, memory sub-system 110 can select two or more parity pages associated with host data pages that are outside a blast radius from one another to be compressed together. For example, if memory sub-system 110 has a blast radius of 1, then page P0A of WL 1 of plane 310 is outside a blast radius of page P6 of WL 3. Accordingly, parity page PP0 corresponding to page P0A and parity page PP6 corresponding to page P6 can be compressed together into a single parity page of multi-page parity data 330, as shown in FIG. 3. Similarly, P1 of WL 1 of plane 310 is outside a blast radius of page P7 of WL 3. Therefore, parity page PP1 corresponding to page P1 and parity page PP7 corresponding to page P7 can be compressed together into a single parity page of multi-page parity data 330. Following the same process, P2 of WL 1 of plane 310 is outside a blast radius of page P8 of WL 3. Therefore, parity page PP2 corresponding to page P2 and parity page PP8 corresponding to page P8 can be compressed together into a single parity page of multi-page parity data 330. In certain implementations, memory sub-system 110 can mark the parity pages of multi-page parity data 330 as compressed party pages, in order to distinguish compressed parity pages form uncompressed parity pages, for example when performing a recovery of certain corrupt host data using the parity data corresponding to the corrupt host data.

Figure 4:
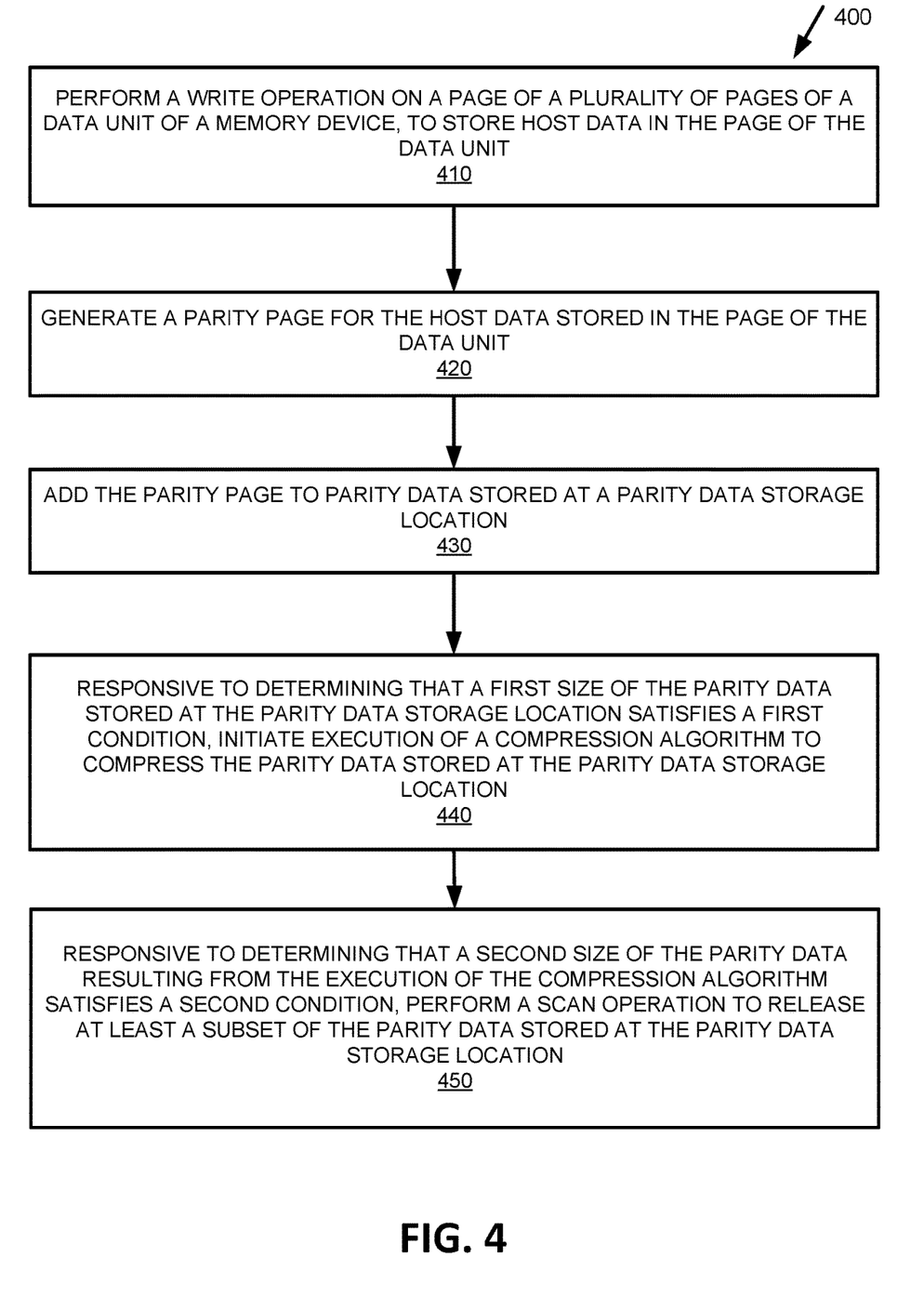
FIG. 4 is a flow diagram of an example method of supporting generating and storing multi-page parity data for a data unit in a memory device, in accordance with some embodiments of the present disclosure.

FIG. 4 is a flow diagram of an example method of supporting generating and storing multi-page parity data for a data unit in a memory device, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by multi-page parity data component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Method 400 starts at operation 410. At operation 410, the processing logic performs a write operation to program data on a page of a data unit of a memory device, to store host data at the page. In one implementation, the processing logic can perform the program operation in response to receiving a request to write host data from a host system.

At operation 420, the processing logic generates a parity page corresponding to the page programmed with host data. In implementations, the parity page may be generated by performing an XOR operation among a particular set of pages of host data, as explained in more details herein. At operation 430, the processing logic can further store the parity page by adding the parity page to parity data stored at a parity data storage location that is dedicated to storing exclusively parity data. In certain implementations, parity data storage location can be a separate memory device within the memory sub-system, as explained in more details herein above.

At operation 440, if the processing logic determines that the size of the stored parity data satisfies a predetermined condition (e.g., that the size of consumed blocks of the parity data storage location exceeds a first threshold), the processing logic can initiate the execution of a compression algorithm to compress the parity data stored at the parity data storage location. In an implementation, the compression algorithm can compress two or more parity pages into a single parity page (e.g., by executing an XOR operation on the two or more parity pages), as explained in more details herein above. The processing logic can also mark the compressed parity page and can then store the compressed parity page at the parity data storage location.

At operation 450, if the processing logic determines that the size of the stored parity data satisfies a second predetermined condition (e.g., that the size of consumed blocks of the parity data storage location exceeds a certain second threshold that is higher than the first threshold), the processing logic can initiate the performance of a scan operation on data units of the memory device. Performing the scan operation can result in releasing parity data from the parity data storage location. For example, parity data associated with host data that is shown to be free from defects, based on the scan results, can be released from the parity data storage location, thus preserving the parity data storage space as explained in more details above.

Figure 5:
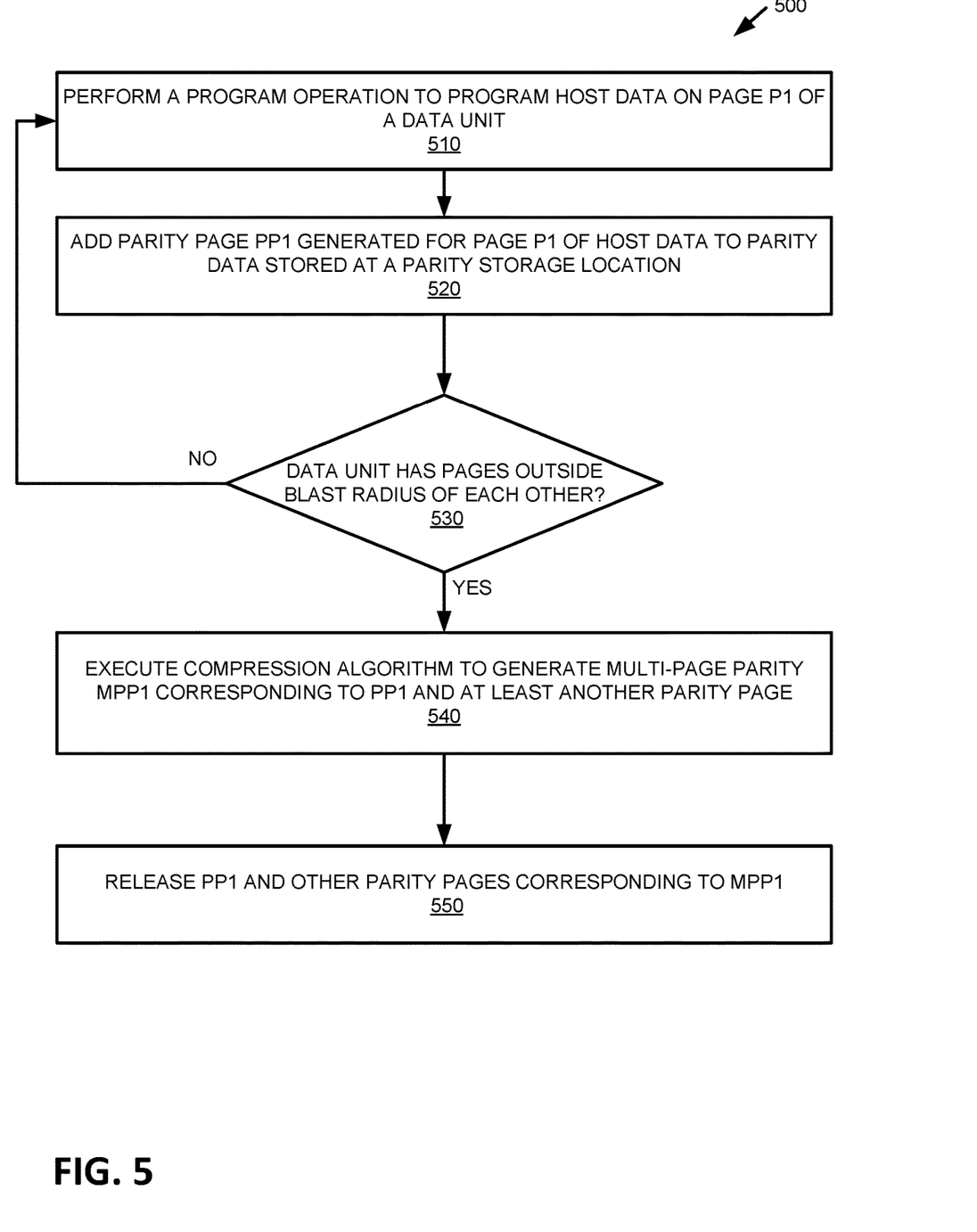
FIG. 5 is a flow diagram of another example method of supporting generating and storing multi-page parity data for a data unit in a memory device, based on a location of the programmed pages of the data unit, in accordance with some embodiments of the present disclosure.

FIG. 5 is a flow diagram of another example method of supporting generating and storing multi-page parity data for a data unit in a memory device, based on a location of the programmed pages of the data unit, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by multi-page parity data component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic performs a program operation to program host data on a page P1 of a data unit. In implementation, in addition to programming the host data, the processing logic also generates parity data corresponding to the programmed host data, as explained in more details herein. At operation 520, the processing logic generates parity data PP1 corresponding to P1 and add parity data PP1 to parity data stored at a parity data storage location that is dedicated to storing exclusively parity data.

At operation 530, the processing logic determines whether or not the data unit has programmed pages that are located, within the data unit, outside a blast radius from one another. As an example, the processing logic determines whether or not programmed pages are located in WLs that are outside a blast radius from each other. In one implementation, the processing logic determines that pages that are located outside a blast radius from each other can be compressed together into a single multi-page parity page, as explained in more details herein.

Accordingly, if the processing logic does not find programmed pages that are located outside a blast radius form one another, the processing logic can decide that the data unit does not have parity page candidates for compression, and can continue to perform program operations as it receives new write requests from the host system.

On the other hand, at operation 540, when the processing logic determines that certain programmed pages of the data unit are located outside a blast radius from each other, the processing logic can execute a compression algorithm to generate a multi-page parity page MPP1, for example, by performing an XOR operation on PP1 and at least one other parity page that corresponds to a programmed page outside a blast radius of P1. The processing logic can further add MPP1 to parity data stored at the parity data storage location of the memory sub-system.

After storing MPP1, the processing logic, at operation 550, can release from the parity data storage location, the uncompressed parity pages that have been compressed into the single parity page MPP1. In this case, PP1 and the at least one other parity page can be released from the parity data storage location, resulting in a reduction in the overall consumed parity blocks of the parity data storage location, as explained in more details herein above.

Figure 6:
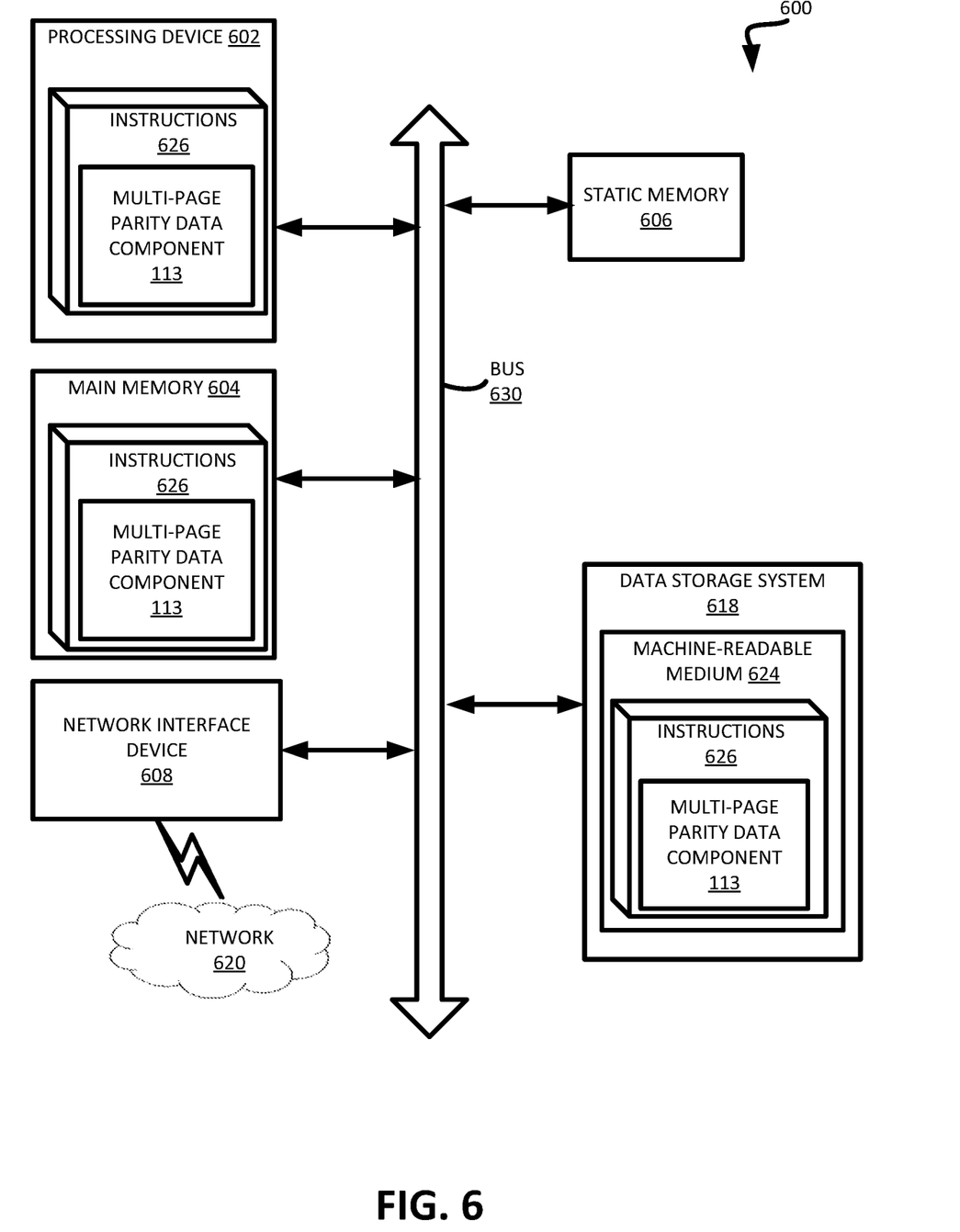
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to multi-page parity data component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to multi-page parity data component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   performing a write operation on a page of a plurality of pages of a data unit of a memory device, to store host data in the page of the data unit;
   generating a parity page for the host data stored in the page of the data unit;
   adding the parity page to parity data stored at a parity data storage location;
   responsive to determining that a first size of the parity data stored at the parity data storage location satisfies a first condition, initiating execution of a compression algorithm to compress multiple parity pages containing uncompressed parity data stored at the parity data storage location to generate a single parity page of compressed parity data; and
   responsive to determining that a second size of the parity data resulting from the execution of the compression algorithm satisfies a second condition, performing a scan operation of the host data stored at the data unit to release at least a subset of the parity data stored at the parity data storage location corresponding to host data that is free from defects as identified based on results of the scan operation.

2. The method of claim 1 further comprising:
   continuing to execute the compression algorithm to compress the parity data stored at the parity data storage location as additional parity pages are added to the parity data as a result of new write operations.

3. The method of claim 1, wherein executing the compression algorithm further comprises:
  performing an exclusive-OR operation on two or more parity pages of the parity data stored at the parity data storage location to generate the single parity page, wherein the two or more parity pages correspond to two or more pages of host data that are located outside a blast radius from each other in the data unit;
  marking the single parity page as a multi-page parity page;
  storing the single parity page at the parity data storage location; and
  releasing the two or more parity pages.

4. The method of claim 1, wherein the parity data storage location comprises a second memory device of a memory sub-system, the memory sub-system further comprising the memory device.

5. The method of claim 1, wherein the parity data storage location comprises a second unit of the memory device, wherein the second unit is dedicated to holding exclusively parity data.

6. The method of claim 1, wherein determining that the first size of the parity data stored at the parity data storage location satisfies the first condition comprises determining that a first percentage of consumed parity blocks of the parity data storage location exceeds a first threshold.

7. The method of claim 6, wherein determining that the second size of the parity data stored at the parity data storage location satisfies the second condition comprises determining that a second percentage of consumed parity blocks of the parity data storage location exceeds a second threshold, the second threshold is higher than the first threshold.

8. The method of claim 1, wherein performing the scan operation further comprises:
  scanning a subset of the plurality of pages of the data unit to determine whether at least one page of the subset has a defect; and
  responsive to determining that none of the subset of the plurality of pages has a defect, releasing parity data associated with the subset of the plurality of pages.

9. A system comprising:
  a memory device; and
  a processing device, operatively coupled with the memory device, to perform operations comprising:
    creating a parity page for host data stored in a page of a plurality of pages of a data unit of a memory device;
    adding the parity page to parity data stored at a parity data storage location;
    responsive to determining that the plurality of pages of the data unit satisfies a first condition, initiating execution of a compression algorithm to compress multiple parity pages containing uncompressed parity data stored at the parity data storage location to generate a single parity page of compressed parity data; and
    responsive to determining that a size of the parity data resulting from the execution of the compression algorithm satisfies a second condition, performing a scan operation of the host data stored at the data unit to release at least a subset of the parity data stored at the parity data storage location corresponding to host data that is free from defects as identified based on results of the scan operation.

10. The system of claim 9, wherein determining that the plurality of pages of the data unit satisfies the first condition further comprises:
  determining that at least two pages of the plurality of pages storing host data are located outside a blast radius from each other in the data unit.

11. The system of claim 9, wherein the processing device is to perform operations further comprising:
  continuing to execute the compression algorithm to compress the parity data stored at the parity data storage location as additional parity pages are added to the parity data as a result of write operations.

12. The system of claim 9, wherein executing the compression algorithm further comprises:
  performing an exclusive-OR operation on two or more parity pages of the parity data stored at the parity data storage location to generate the single parity page, wherein the two or more parity pages correspond to two or more pages of the host data that are located outside a blast radius from each other in the data unit;
  marking the single parity page as a multi-page parity page;
  storing the single parity page at the parity data storage location; and
  releasing the two or more parity pages.

13. The system of claim 9, wherein the parity data storage location comprises a second memory device of a memory sub-system, the memory sub-system further comprising the memory device.

14. The system of claim 9, wherein the parity data storage location comprises a second unit of the memory device, wherein the second unit is dedicated to holding exclusively parity data.

15. The system of claim 9, wherein determining that the size of the parity data stored at the parity data storage location satisfies the second condition comprises determining that a percentage of consumed parity blocks of the parity data storage location exceeds a threshold.

16. A non-transitory computer-readable storage medium comprising instructions that, when executed by a processing device, cause the processing device to perform operations comprising:
  performing a write operation on a page of a plurality of pages of a data unit of a memory device, to store host data in the page of the data unit;
  generating a parity page for the host data stored in the page of the data unit;
  adding the parity page to parity data stored at a parity data storage location;
  responsive to determining that a first size of the parity data stored at the parity data storage location satisfies a first condition, initiating execution of a compression algorithm to compress multiple parity pages containing uncompressed parity data stored at the parity data storage location to generate a single parity page of compressed parity data; and
  responsive to determining that a second size of the parity data resulting from the execution of the compression algorithm satisfies a second condition, performing a scan operation of the host data stored at the data unit to release at least a subset of the parity data stored at the parity data storage location corresponding to host data that is free from defects as identified based on results of the scan operation.

17. The non-transitory computer-readable storage medium of claim 16, wherein the operations further comprise:
  continuing to execute the compression algorithm to compress the parity data stored at the parity data storage location as additional parity pages are added to the parity data as a result of new write operations.

18. The non-transitory computer-readable storage medium of claim 16, wherein determining that the first size of the parity data stored at the parity data storage location satisfies the first condition comprises:
   determining that a first percentage of consumed parity blocks of the parity data storage location exceeds a first threshold.

19. The non-transitory computer-readable storage medium of claim 16, wherein determining that the second size of the parity data stored at the parity data storage location satisfies the second condition comprises:
   determining that a second percentage of consumed parity blocks of the parity data storage location exceeds a second threshold, the second threshold is higher than the first threshold.

20. The non-transitory computer-readable storage medium of claim 16, wherein performing the scan operation comprises:
   scanning a subset of the plurality of pages of the data unit to determine whether at least one page of the subset has a defect; and
   responsive to determining that none of the subset of the plurality of pages has a defect, releasing parity data associated with the subset of the plurality of pages.

* * * * *